United States Patent
Yonekawa (10) Patent No.: US 11,798,818 B2
(45) Date of Patent: Oct. 24, 2023

(54) CONTAINER, PROCESSING APPARATUS, PARTICLE REMOVING METHOD, AND METHOD OF MANUFACTURING ARTICLE

(71) Applicant: CANON KABUSHIKI KAISHA, Tokyo (JP)

(72) Inventor: Masami Yonekawa, Utsunomiya (JP)

(73) Assignee: CANON KABUSHIKI KAISHA, Tokyo (JP)

(*) Notice: Subject to any disclaimer, the term of this patent is extended or adjusted under 35 U.S.C. 154(b) by 339 days.

(21) Appl. No.: 16/695,266

(22) Filed: Nov. 26, 2019

(65) Prior Publication Data

US 2020/0176275 A1 Jun. 4, 2020

(30) Foreign Application Priority Data

Dec. 3, 2018 (JP) .................................. 2018-226725

(51) Int. Cl.
*H01L 21/67* (2006.01)
*G03F 7/00* (2006.01)

(52) U.S. Cl.
CPC ...... *H01L 21/67011* (2013.01); *G03F 7/0002* (2013.01)

(58) Field of Classification Search
CPC ......... H01L 21/67011; H01L 21/67396; H01L 21/02046; H01L 21/67028; H01L 21/67389; H01L 21/67766; G03F 7/0002
See application file for complete search history.

(56) References Cited

U.S. PATENT DOCUMENTS

| | | | | |
|---|---|---|---|---|
| 5,350,429 A | * | 9/1994 | Mohr | C10M 133/58 564/511 |
| 5,410,122 A | * | 4/1995 | Su | H01J 37/32431 204/298.34 |
| 5,584,938 A | * | 12/1996 | Douglas | B08B 6/00 15/151 |
| 5,858,108 A | * | 1/1999 | Hwang | H01L 21/67028 134/1 |
| 6,177,356 B1 | * | 1/2001 | Zinman | H01L 21/02043 257/E21.224 |
| 6,199,927 B1 | * | 3/2001 | Shamlou | H01L 21/68707 294/185 |
| 6,526,997 B1 | * | 3/2003 | Henley | B08B 6/00 257/E21.252 |

(Continued)

FOREIGN PATENT DOCUMENTS

| | | | |
|---|---|---|---|
| JP | 06252066 A | * | 9/1994 |
| JP | 2000260671 A | | 9/2000 |
| JP | 2015126092 A | | 7/2015 |

OTHER PUBLICATIONS

Translation of JPH06252066A. (Year: 2022).*

*Primary Examiner* — Alexander Markoff
(74) *Attorney, Agent, or Firm* — ROSSI, KIMMS & McDOWELL LLP (57) ABSTRACT

The present invention provides a container for containing a plate to be used to remove particles in a processing apparatus for processing a substrate, comprising: a charging unit configured to charge the stored plate, wherein the charging unit includes a contactor configured to be in contact with the plate, and is configured to charge the plate by supplying electric charges to the plate via the contactor and then separating the contactor from the plate.

7 Claims, 9 Drawing Sheets

(56) References Cited

U.S. PATENT DOCUMENTS

| | | | | |
|---|---|---|---|---|
| 7,047,984 B2* | 5/2006 | Blattner | ............... | G03F 7/70741 |
| | | | | 15/345 |
| 8,337,629 B2* | 12/2012 | Moriya | ............. | H01J 37/32862 |
| | | | | 134/1 |
| 2002/0066692 A1* | 6/2002 | Smith | ............... | H01L 21/67353 |
| | | | | 206/454 |
| 2003/0129045 A1* | 7/2003 | Bonora | ............. | H01L 21/67709 |
| | | | | 414/217 |
| 2004/0016443 A1* | 1/2004 | Sasaki | ............... | H01L 21/67028 |
| | | | | 15/1.51 |
| 2007/0246957 A1* | 10/2007 | Liu | ................... | H01L 21/68707 |
| | | | | 294/213 |
| 2009/0022901 A1* | 1/2009 | Ray | .................... | H01L 21/6833 |
| | | | | 427/458 |
| 2009/0028672 A1* | 1/2009 | Yamawaku | ....... | H01L 21/67781 |
| | | | | 414/217 |
| 2011/0253042 A1* | 10/2011 | Ray | .................... | H01L 21/6833 |
| | | | | 118/500 |
| 2017/0125272 A1* | 5/2017 | van Gogh | ......... | H01L 21/67178 |
| 2018/0048169 A1* | 2/2018 | Bello | ................ | H01L 21/67379 |
| 2018/0090355 A1* | 3/2018 | Keam | ................ | H01L 21/6773 |

\* cited by examiner

CONTAINER, PROCESSING APPARATUS, PARTICLE REMOVING METHOD, AND METHOD OF MANUFACTURING ARTICLE

BACKGROUND OF THE INVENTION

Field of the Invention

The present invention relates to a container for containing a plate to be used for a particle removing process, a processing apparatus, a particle removing method, and a method of manufacturing an article.

Description of the Related Art

In a substrate processing apparatus for processing a substrate to manufacture a semiconductor device or the like, if particles existing in the apparatus adhere to a substrate and the like, it may become difficult to correctly process the substrate. An example of the substrate processing apparatus is a lithography apparatus for forming a pattern on a substrate. Among others, an imprint apparatus brings a mold and an imprint material on a substrate into direct contact with each other. Thus, if there are particles between the mold and the substrate, a pattern formed on the substrate may be defective and the life of the mold may become short. To solve this problem, the substrate processing apparatus can perform a process of removing particles in the apparatus.

Japanese Patent Laid-Open No. 2000-260671 proposes a technique of removing dust floating in an apparatus by charging, by a corona discharge method, a dust attracting wafer covered with an insulating film and conveying the charged wafer into the apparatus. Furthermore, Japanese Patent Laid-Open No. 2015-126092 proposes a technique of attracting and collecting particles in an apparatus by charging, by a corona discharge method, a cleaning wafer made of an insulating material and conveying the charged wafer into the apparatus.

In each of Japanese Patent Laid-Open Nos. 2000-260671 and 2015-126092, a method of charging a wafer using the corona discharge method is used. In general, in this method, it is possible to give a positive or negative charge to a target object (wafer) by applying a high voltage of several kV to an electrode needle to generate an electric field around the electrode needle, and using a corona discharge phenomenon that occurs persistently from the electrode needle. However, since ozone is generated in the corona discharge method, the oxidation power of ozone may oxidize the substrate and the like, and degrade parts in the apparatus. Dust may be generated by the electrode needle itself oxidizing/degrading due to discharge.

SUMMARY OF THE INVENTION

The present invention provides, for example, a technique advantageous in performing a particle removing process effectively.

According to one aspect of the present invention, there is provided a container for containing a plate to be used to remove particles in a processing apparatus for processing a substrate, comprising: a charging unit configured to charge the stored plate, wherein the charging unit includes a contactor configured to be in contact with the plate, and is configured to charge the plate by supplying electric charges to the plate via the contactor and then separating the contactor from the plate.

Further features of the present invention will become apparent from the following description of exemplary embodiments with reference to the attached drawings.

DESCRIPTION OF THE EMBODIMENTS

Exemplary embodiments of the present invention will be described below with reference to the accompanying drawings. Note that the same reference numerals denote the same members throughout the drawings, and a repetitive description thereof will not be given.

The present invention is applied to a substrate processing apparatus for processing a substrate. Examples of the substrate processing apparatus are an application apparatus for applying a photosensitive medium onto a substrate, and a developing apparatus for developing a substrate on which a latent pattern is formed. Other examples of the substrate processing apparatus are a deposition apparatus for forming a film on a substrate, a planarization apparatus for planarizing a composition on a substrate using a mold having a planar shape, and a lithography apparatus for forming a pattern on a substrate. Examples of the lithography apparatus are an imprint apparatus for forming a pattern of an imprint material on a substrate using a mold, an exposure apparatus for exposing a substrate to transfer a pattern of a mask to the substrate, and a drawing apparatus for forming a pattern on a substrate using a charged particle beam. In each of the following embodiments, an imprint apparatus will be exemplified as a substrate processing apparatus.

First Embodiment

The first embodiment of the present invention will be described. In general, an imprint apparatus is an apparatus that brings a mold and an imprint material supplied onto a substrate into contact with each other and gives, to the imprint material, energy for curing, thereby forming the pattern of a cured product to which the uneven pattern of a mold is transferred. The imprint apparatus according to this embodiment is used to manufacture a semiconductor device and the like, and performs an imprint process of transferring, using a mold (original) with an uneven pattern, the pattern to the imprint material supplied onto a shot region of the substrate. For example, the imprint apparatus cures the imprint material on the substrate in a state in which the mold with the pattern is in contact with the imprint material. The imprint apparatus can increase the interval between the mold and the substrate to separate (release) the mold from the cured imprint material, thereby forming the pattern of the imprint material on the substrate.

As the imprint material, a curable composition (to also be referred to as a resin in an uncured state hereinafter) to be cured by energy for curing is used. As the energy for curing, an electromagnetic wave, heat, or the like is used. The electromagnetic wave is, for example, light such as infrared rays, visible light, or UV rays whose wavelength is selected from the range of 10 nm (inclusive) to 1 mm (inclusive).

The curable composition is a composition cured by light irradiation or heating. A photo-curable composition cured by light contains at least a polymerizable compound and a photopolymerization initiator, and may contain a nonpolymerizable compound or a solvent, as needed. The nonpolymerizable compound is at least one material selected from the group consisting of a sensitizer, a hydrogen donor, an internal mold release agent, a surfactant, an antioxidant, a polymer component, or the like.

The imprint material is applied in a film shape onto the substrate by a spin coater or a slit coater. Alternatively, the imprint material may be applied, onto the substrate, in a droplet shape or in an island or film shape formed by connecting a plurality of droplets using a liquid injection head. The viscosity (viscosity at 25° C.) of the imprint material is, for example, 1 mPa's to 100 mPa's.

As the substrate, glass, ceramic, a metal, a semiconductor, a resin, or the like is used. A member made of a material different from that of the substrate may be formed on the surface of the substrate, as needed. More specifically, the substrate is a silicon wafer, a compound semiconductor wafer, silica glass, or the like. In addition, an adhesion layer may be provided to improve the adhesion between the imprint material and the substrate, as needed, before application of the imprint material.

The mold has, for example, a rectangular peripheral shape, and is generally made of a material such as quartz that can transmit light (for example, UV rays). A three-dimensional uneven pattern to be transferred as a device pattern (circuit pattern) to the imprint material on the substrate is formed on the surface (pattern surface) of the mold on the substrate side.

[Arrangement of Imprint Apparatus]

Figure 1:
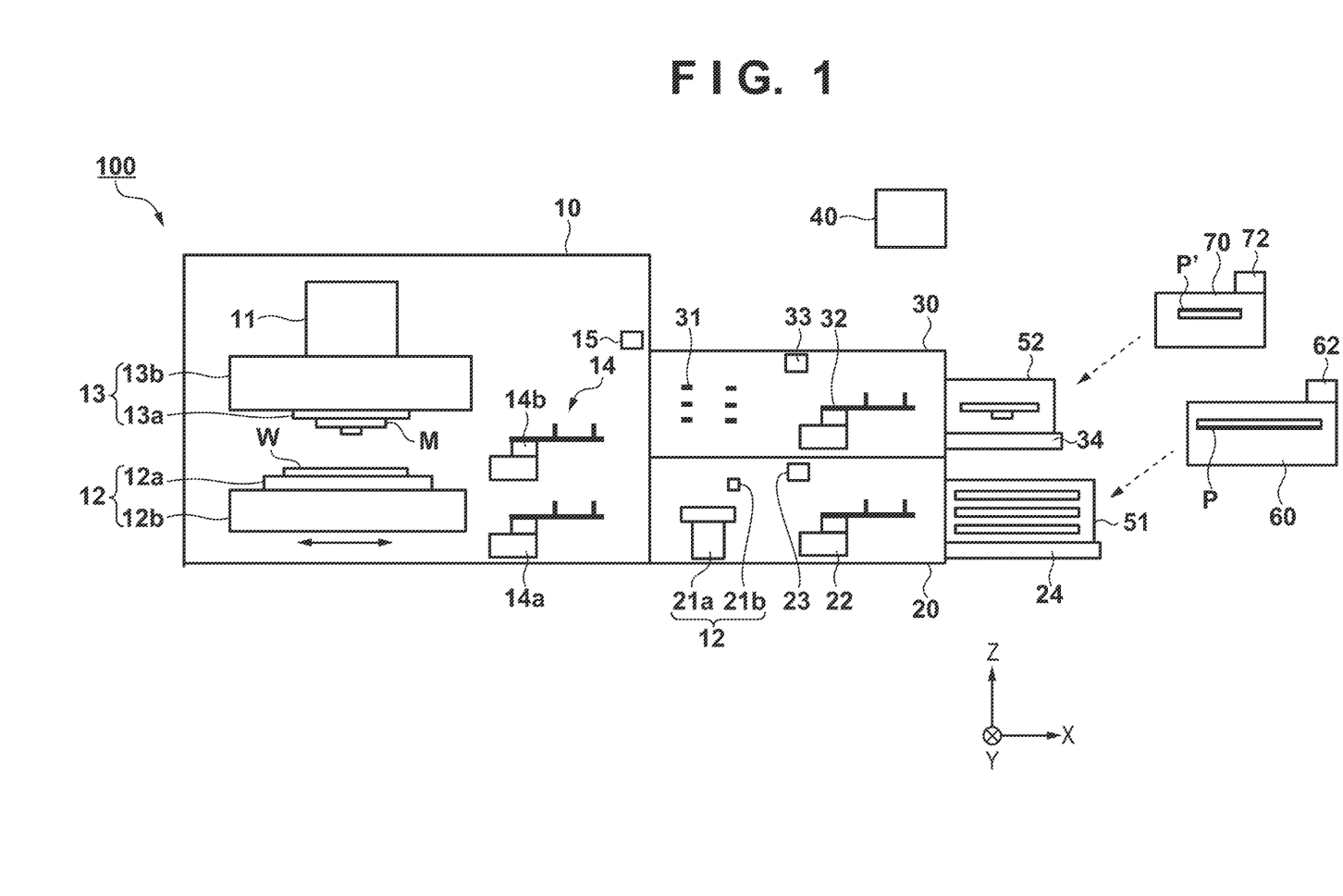
FIG. 1 is a schematic view showing the arrangement of an imprint apparatus according to the first embodiment.

FIG. 1 is a schematic view showing the arrangement of an imprint apparatus 100 according to this embodiment. In this embodiment, the imprint apparatus 100 adopts a photo-curing method of curing an imprint material by irradiation of light (UV rays). However, the method is not limited to this, and the imprint apparatus 100 can adopt a heat-curing method of curing an imprint material by heat, for example. Note that throughout the drawings, a direction parallel to the irradiation axis of light (UV rays) to a mold M is set as a Z-axis direction in an XYZ coordinate system, and two directions orthogonal to each other within a plane perpendicular to the Z-axis are set as an X-axis direction and a Y-axis direction.

The imprint apparatus 100 includes, for example, a processing unit 10 that performs an imprint process, a preprocessing unit 20 that performs preprocessing of a substrate W, a storage unit 30 that temporarily stores the mold M (original), and a control unit 40. The control unit 40 is formed by, for example, a computer including a CPU and a memory, and comprehensively controls the respective units of the imprint apparatus 100 (controls the imprint process). In this embodiment, the preprocessing of the substrate W includes, for example, a pre-alignment process of performing rough alignment of the substrate W by sensing the periphery and notch (or orientation flat) of the substrate W while rotationally driving the substrate W.

The arrangement of the processing unit 10 will be described first. The processing unit 10 can include, for example, a curing unit 11, a substrate stage 12 that can move while holding the substrate W, an imprint head 13 that holds the mold M, a conveyance unit 14, and a neutralization unit 15.

The curing unit 11 cures an imprint material on the substrate by irradiating the imprint material with light (UV rays) through the mold M in a state in which the mold M is in contact with the imprint material. The curing unit 11 includes, for example, a light source and an optical system, and the optical system is formed from a plurality of optical elements (a lens, a mirror, a light-shielding plate, and the like) for adjusting light from the light source into a light state (an intensity distribution, an illumination region, and the like) suitable for the imprint process. Since this embodiment adopts the photo-curing method, the light source is provided in the curing unit 11. However, if the heat-curing method is adopted, a heat source can be provided in the curing unit 11.

The substrate stage 12 includes, for example, a substrate chuck 12a and a substrate driving unit 12b, and is configured to be movable while holding the substrate W. The substrate chuck 12a attracts and holds the substrate W with, for example, a vacuum attraction force, an electrostatic force, or the like. The substrate driving unit 12b includes an actuator such as a linear motor or an air cylinder, and drives the substrate W in the X-axis direction and the Y-axis direction to control the relative positions of the mold M and the substrate W by adjusting the position of the substrate W at the time of the imprint process. The substrate driving unit 12b may be formed from a plurality of driving systems such as a coarse driving system and a fine driving system in order to accurately position the substrate W. The substrate driving unit 12b may be configured to have a function of adjusting the position of the substrate W not only in the X-axis direction and the Y-axis direction but also in the Z-axis direction and a θ direction (a rotation direction about the Z-axis), and a tilt function of adjusting the tilt of the substrate W.

The imprint head 13 (mold holding unit) can include, for example, a mold chuck 13a and a mold driving unit 13b. The mold chuck 13a attracts and holds the mold M with, for example, a vacuum attraction force, an electrostatic force, or the like. The mold driving unit 13b includes an actuator such as a linear motor or an air cylinder, and drives the mold M in the Z-axis direction to selectively perform pressing (mold pressing) of the mold M against the imprint material on the substrate and separation (release) of the mold M from the cured imprint material. The mold driving unit 13b may be formed from a plurality of driving systems such as a coarse driving system and a fine driving system in order to accurately position the mold M. The mold driving unit 13b may be configured to have a function of adjusting the position of the mold M not only in the Z-axis direction but also in the X-axis direction, the Y-axis direction, and the θ direction, and a tilt function of adjusting the tilt of the mold M.

In this embodiment, the mold pressing and release of the mold M against and from the imprint material on the substrate are performed when the mold driving unit 13b drives the mold M in the Z-axis direction, but may be performed when the substrate driving unit 12b drives the substrate W in the Z-axis direction. Alternatively, the mold pressing and release of the mold M may be performed when the mold driving unit 13b and the substrate driving unit 12b relatively drive the mold M and the substrate W in the Z-axis direction in cooperation with each other.

The conveyance unit 14 can include a substrate conveyance unit 14a that conveys the substrate W, and a mold conveyance unit 14b (original conveyance unit) that conveys the mold M. The substrate conveyance unit 14a includes, for example, a conveyance robot formed by a hand for holding the substrate W and an arm for driving the hand, and conveys, to the substrate stage 12, the substrate W having undergone the pre-alignment process by the preprocessing unit 20. The substrate W conveyed to the substrate stage 12 by the substrate conveyance unit 14a is held by the substrate chuck 12a. The mold conveyance unit 14b includes, for example, a conveyance robot formed by a hand for holding the mold M and an arm for driving the hand, and conveys, to the imprint head 13, the mold M temporarily stored in the storage unit 30. The mold M conveyed to the imprint head 13 by the mold conveyance unit 14b is held by the mold chuck 13a.

The neutralization unit 15 includes an ionizer for discharging ions into the processing unit 10, and electrically neutralizes the mold M and the substrate W. The mold M and the substrate W are charged by coming into contact with various parts and separating from them during conveyance, and are charged by separating the mold M from the cured imprint material on the substrate. Therefore, the neutralization unit 15 is provided in the processing unit 10 to prevent the mold M and the substrate W from being charged more than necessary by discharging ions into the processing unit 10.

Figure 4:
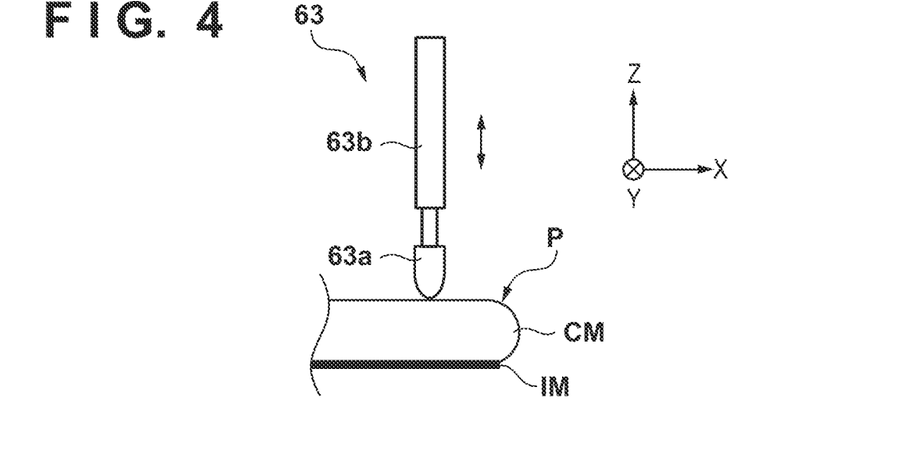
FIG. 4 is a view showing an example of the arrangement of a contactor.

Although not shown in FIG. 4, the processing unit 10 may be provided with an aligmnent measurement unit (alignment scope), a liquid supply unit, and a gas supply unit. An alignment detection unit detects an alignment mark provided in the mold M and a mark provided in the substrate W, and measures the relative positions of the mold M and the substrate W in the X-axis direction and Y-axis direction. The liquid supply unit supplies a liquid imprint material onto the substrate. The liquid supply unit supplies the imprint material based on preset supply amount information, and the supply amount information can be set in accordance with, for example, the density and thickness (residual layer thickness) of the pattern of the imprint material to be formed on the substrate. Furthermore, the gas supply unit has a function of supplying a gas to decrease particles entering a portion around the mold M and the substrate W.

The arrangement of the preprocessing unit 20 will be described next. The preprocessing unit 20 can include a pre-alignment unit 21, a substrate conveyance unit 22, and a neutralization unit 23. The pre-alignment unit 21 includes, for example, a holding unit 21a that holds and rotationally drives the substrate W, and a sensing unit 21b that senses the periphery and notch (or orientation flat) of the substrate W, and performs a pre-alignment process. The substrate conveyance unit 22 includes, for example, a conveyance robot formed by a hand for holding the substrate W and an arm for driving the hand, and conveys, to the pre-alignment unit 21 (holding unit 21a), the substrate W contained in a substrate container 51. The substrate container 51, for example, is a FOUP (Front Opening Unified Pod) that contains the substrate W by a mini-environment method, and is placed on a placement unit 24 provided in the preprocessing unit 20. The placement unit 24 can be, for example, the load port of an EFEM (Equipment Front End Module). The placement unit 24 according to this embodiment is formed as an arrangement table on which the substrate container 51 is arranged, but is not limited to this, and, for example, may be formed as an attachment mechanism to which the substrate container 51 can be attached. The neutralization unit 23 includes an ionizer for discharging ions into the preprocessing unit 20, and electrically neutralizes the substrate W in the preprocessing unit 20. For example, the neutralization unit 23 can be arranged to electrically neutralize the substrate W during conveyance by the substrate conveyance unit 22.

The arrangement of the storage unit 30 will be described next. The storage unit 30 can include a stocker 31, a mold conveyance unit 32 (original conveyance unit), and a neutralization unit 33. The stocker 31 is a shelf in which the mold M is temporarily stored (arranged or held), and is configured to be able to store a plurality of molds M (three molds M in FIG. 4) in this embodiment. The mold conveyance unit 32 includes, for example, a conveyance robot formed by a hand for holding the mold M and an arm for driving the hand, and conveys, to the stocker 31, the mold M contained in a mold container 52. The mold container 52 is, for example, a SMIF (Standard Mechanical Interface) pod that contains the mold M by a mini-environment method, and is placed on a placement unit 34 provided in the storage unit 30. The placement unit 34 can be, for example, the load port of an EFEM (Equipment Front End Module). The placement unit 34 according to this embodiment is formed as a mounting table on which the mold container 52 is mounted, but is not limited to this, and, for example, may be formed as an attachment mechanism to which the mold container 52 can be attached. The neutralization unit 33 includes an ionizer for discharging ions into the storage unit 30, and electrically neutralizes the mold M in the storage unit 30. For example, the neutralization unit 33 can be arranged to electrically neutralize the mold M during conveyance by the mold conveyance unit 32.

[Charging of Cleaning Plate]

In the imprint apparatus 100, if particles existing in the apparatus adhere to the mold M, the substrate W, and the like, it may become difficult to correctly perform the imprint process. For example, since the imprint apparatus 100 brings the mold M and the imprint material on the substrate into direct contact with each other, if there are particles between the mold M and the substrate W, a pattern formed on the substrate may be defective and the life of the mold M may become short. To solve this problem, the imprint apparatus 100 performs a process (that is, a cleaning process) of removing particles in the apparatus.

Figure 2:
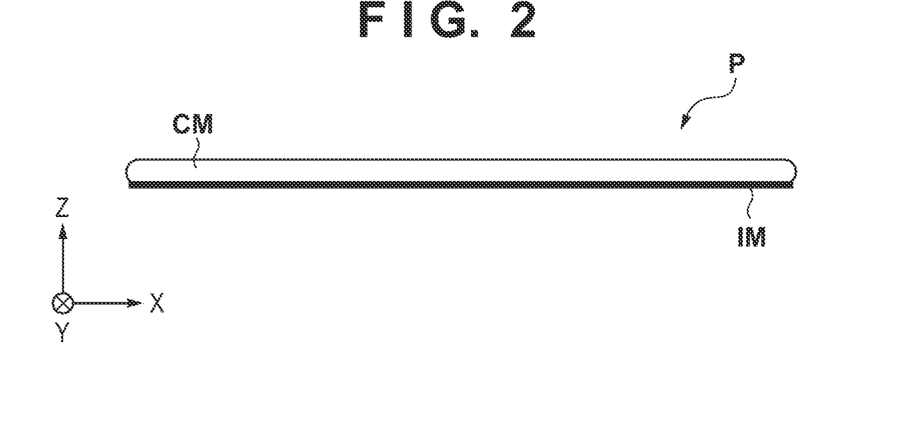
FIG. 2 is a view showing an example of the arrangement of a plate P.

In the cleaning process, it is possible to cause a dedicated plate P (maintenance wafer) to attract particles in the apparatus with an electrostatic force by conveying the charged plate P into the apparatus, thereby decreasing (removing) the particles in the apparatus. The plate P preferably has the same outer shape as that of the substrate W to undergo the imprint process, and is charged by a charging unit 62 (to be described later). The plate P may be formed by only an electrically conductive member, but may have an arrangement in which at least part of an electrically conductive member is covered with an insulating member so as to be able to maintain (hold) a state in which particles in the apparatus are attracted with an electrostatic force. In this embodiment, as shown in FIG. 2, the plate P can include an electrically conductive member CM and an insulating member IM that covers the electrically conductive member CM so that a part of the electrically conductive member CM is exposed. As the electrically conductive member CM of the plate P, for example, a silicon substrate (bare silicon), a metal plate, a glass plate and a resin plate on the surfaces of which an electrically conductive film is formed, or the like can be applied. The metal plate preferably undergoes surface polishing so as to reduce dust generation. As the insulating member IM of the plate P, for example, an acrylic resin, a polyimide resin, a polyolefin resin, a polyamide resin, or the like can be applied.

In the example of the arrangement of the plate P shown in FIG. 2, the insulating member IM is provided only on a surface (lower surface) held by the substrate chuck 12a but the present invention is not limited to this. For example, the insulating member IM may be provided so that the electrically conductive member CM is exposed in a part which a contactor 63 of the charging unit 62 (to be described later) contacts. That is, if an exposed part of the electrically conductive member CM is formed in the part which the contactor 63 of the charging unit 62 contacts, the insulating member IM may also be provided on the upper surface of the plate P.

A method of charging the plate P for the cleaning process will be described next. In this embodiment, the charging unit 62 is provided in a container 60 that contains the plate P, and the container 60 can be formed by, for example, a FOUP similar to the substrate container 51. If the container 60 of the plate P is formed by a FOUP, the container 60 can be placed on the placement unit 24 (the load port of the EFEM) of the preprocessing unit 20, as shown in FIG. 1, instead of the substrate container 51. In a state in which the plate P having undergone the cleaning process is contained in the container 60, it is possible to carry the container 60 out from the imprint apparatus 100 to an external particle inspection apparatus, and perform inspection such as component analysis of particles adhering to the surface of the plate P.

Figure 3:
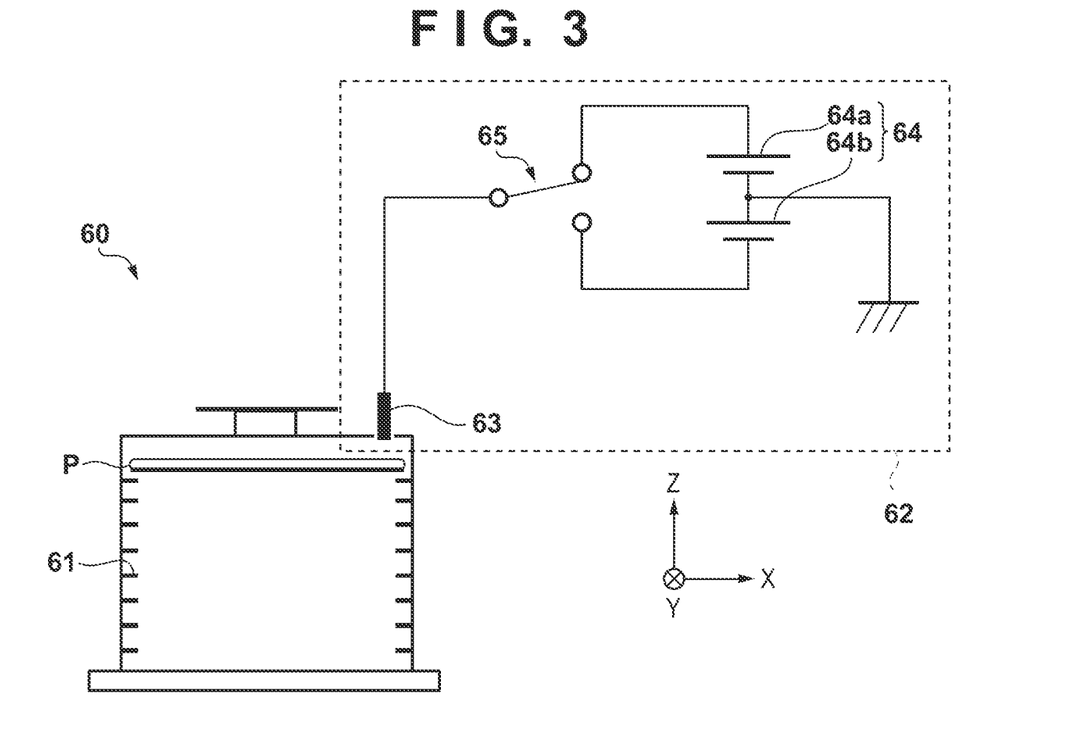
FIG. 3 is a view showing the arrangement of a container for containing the plate P.

FIG. 3 is a view showing the arrangement of the container 60 that contains the plate P. The container 60 includes a support unit 61 (slot unit) that supports the plate P, and the charging unit 62 that charges the plate P supported by the support unit 61 in the container. In the example shown in FIG. 3, to make the arrangement easy to understand, the charging unit 62 is enlarged. If the plate P is charged automatically, a control unit that controls the charging unit 62 may be provided in the container 60. When the container 60 is placed on the placement unit 24, the charging unit 62 and the control unit 40 of the imprint apparatus 100 may communicably be connected, and the control unit 40 may control the charging unit 62.

The support unit 61 is formed in, for example, a shelf shape so as to be able to contain the plurality of plates P, and is configured to support the plate P in contact with the peripheral portion of the plate P. The support unit 61 may be configured to be in contact with the insulating member IM of the plate P so as to prevent electric charges from being released from the charged plate P, and may be made of an insulating material.

The charging unit 62 includes the contactor 63 (contact probe) that contacts the exposed part of the electrically conductive member CM of the plate P, a power supply unit 64 that applies a voltage to the plate P via the contactor 63, and a switching unit 65 that switches a polarity to which the plate P is charged. As shown in FIG. 4, the contactor 63 can include a plunger 63a that contacts the exposed part of the electrically conductive member CM of the plate P, and a barrel 63b that elastically supports the plunger 63a by a spring or the like. If, in this arrangement, the barrel 63b is manually or automatically driven vertically by a driving mechanism (not shown), it is possible to bring the contactor 63 (plunger 63a) into contact with the plate P with a predetermined pressure. To reduce dust generation as much as possible while ensuring the conductivity, the plunger 63a has, for example, a spherical distal end, and is preferably made of a metal material that wears little and is hardly oxidized.

Figure 5:
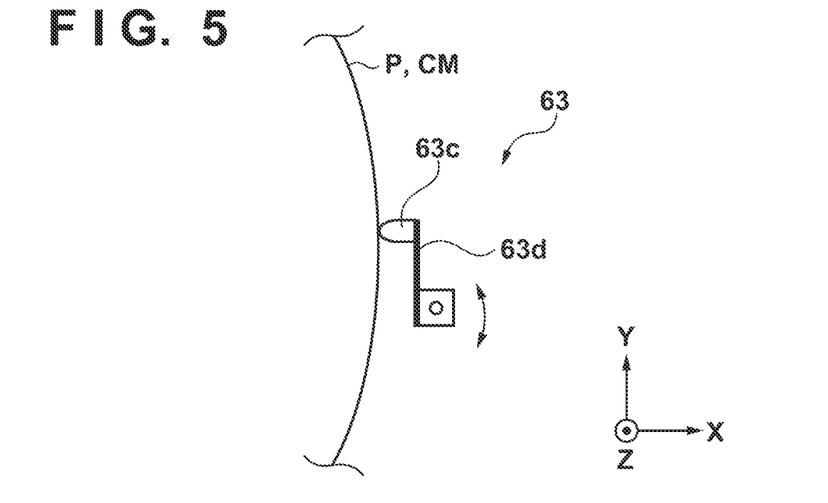
FIG. 5 is a view showing another example of the arrangement of the contactor.

The arrangement of the contactor 63 is not limited to that including the plunger 63a and the barrel 63b, and the contactor 63 may have another arrangement. FIG. 5 is a view showing a modification of the contactor 63, and is a view when viewed from above the contactor 63. In the example shown in FIG. 5, the rotating contact 63 is formed by a terminal 63c that contacts the edge of the plate P, and a leaf spring 63d for controlling the contact pressure of the terminal 63c against the plate P. By forming the contactor 63 so as to come in contact with the edge of the plate P, it is possible to improve the degree of freedom in designing the container 60 (for example, the support unit 61).

The power supply unit 64 is configured to change the polarity to which the plate P is charged, and can include, for example, a plurality of types of power supplies. More specifically, the power supply unit 64 can include a power supply 64a whose negative pole is grounded and whose positive pole can be connected to the contactor 63 (plunger 63a) via the switching unit 65, and a power supply 64b whose positive pole is grounded and whose negative pole can be connected to the contactor 63 (plunger 63a) via the switching unit 65. Furthermore, the switching unit 65 can be formed as a switch that switches the power supply to be electrically connected to the contactor 63 in order to charge the plate P to the first or second polarity selectively. The first and second polarities are opposite to each other, and one can be the positive polarity and the other can be the negative polarity. For example, when positively charging the plate P, the switching unit 65 connects the power supply 64a to the contactor 63, and when negatively charging the plate P, the switching unit 65 connects the power supply 64b to the contactor 63. Note that the switching unit 65 can also have a function as a switch that switches ON/OFF of application of a voltage to the contactor 63.

Figure 6:
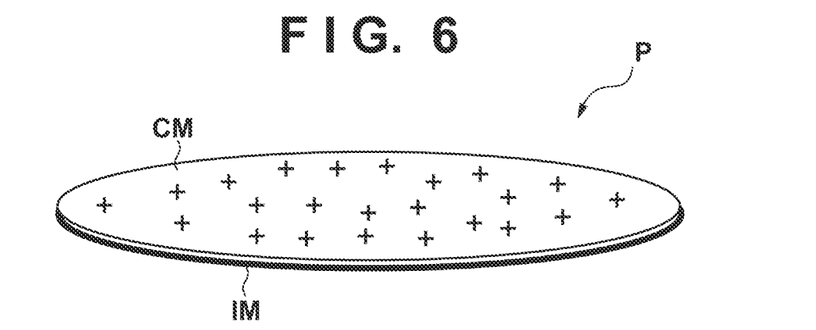
FIG. 6 is a view showing the charged plate P.

The charging unit 62 with the above arrangement presses the contactor 63 against the exposed part of the electrically conductive member CM of the plate P with a predetermined pressure, and applies, in this state, a voltage to the plate P via the contactor 63 by the power supply unit 64 (64a or 64b), thereby supplying electric charges to the plate P. If a predetermined time elapses and a predetermined amount of electric charges is accumulated in the plate P, the contactor 63 is separated from the plate P in a state in which the contactor 63 and the power supply unit 64 are connected to each other. This can charge the plate P and maintain (hold) the state in which the plate P is charged, as shown in FIG. 6. According to this embodiment, it is possible to uniform the electric charge distribution by the electrically conductive member CM of the plate P, readily control the surface potential of the plate P, and ensure the reproducibility.

Furthermore, since the charging unit 62 according to this embodiment charges the plate P by bringing the contactor 63 into contact with the plate P, the following problem arising when charging the plate using the corona discharge method hardly occurs. For example, the corona discharge method generates an electric field around an electrode needle by applying a high voltage of several kV to the electrode needle. However, since ozone is generated, the oxidation power of ozone may oxidize the plate and the like and degrade parts in the apparatus. The electrode needle itself may be oxidized/degraded to generate dust due to discharge. A gas component in an atmosphere may be made into particles, and large particles accumulated at the electrode tip may be scattered. In addition, depending on the insulating material of the plate, the insulating film may get a hole due to corona discharge, and the electric charge distribution in the insulating film of the plate may become nonuniform. Especially, a discharge mark called a static mark is readily generated near the electrode tip, and it may be difficult to uniformly control the surface potential.

[Cleaning Process]

Figure 7:
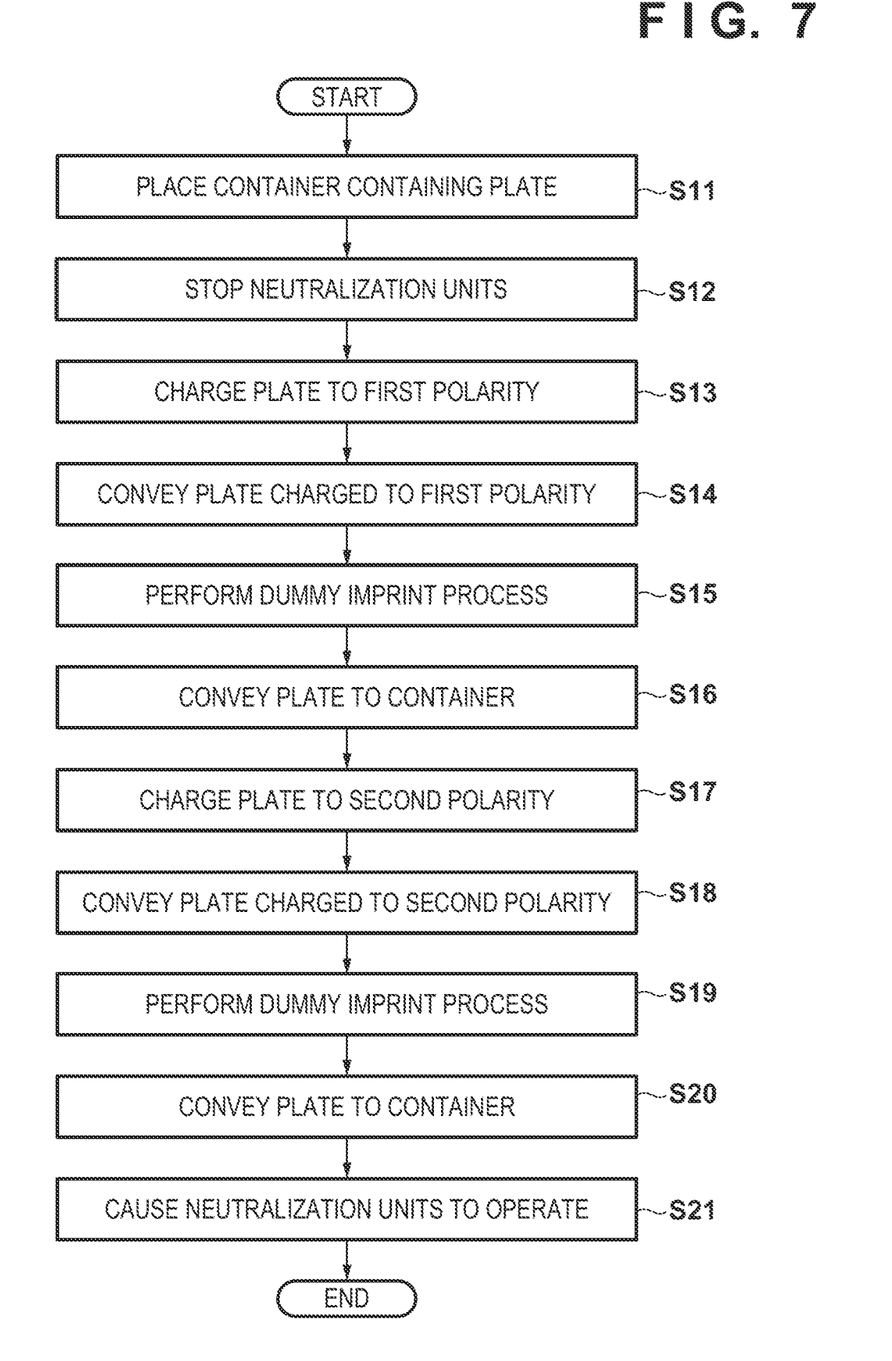
FIG. 7 is a flowchart illustrating a cleaning process.

The cleaning process (particle removing process) in the imprint apparatus will be described next. FIG. 7 is a flowchart illustrating the cleaning process. In steps of the flowchart shown in FIG. 7, an example of performing the cleaning process using the first plate charged to the first polarity and the second plate charged to the second polarity is shown. The first and second polarities are opposite to each other, and one is the positive polarity and the other is the negative polarity.

In step S11, the container 60 that contains the first and second plates as the cleaning plates P is placed on the placement unit 24 of the preprocessing unit 20. The container 60 can be placed by a conveyance system provided outside the imprint apparatus 100. At this time, the control unit 40 determines whether the container 60 is placed on the placement unit 24 (that is, whether the plates P (the first and second plates) for the cleaning process are ready). In step S12, the neutralization units 15 and 23 (substrate neutralization units) are stopped. The reason why the neutralization units 15 and 23 are stopped is that if ions are discharged from the neutralization units 15 and 23 when conveying the charged plates P into the imprint apparatus, the electric charge amounts of the plates P are reduced.

In step S13, the charging unit 62 of the container 60 charges the first plate to the first polarity. The first plate may be charged manually or automatically. If the first plate is charged automatically, the control unit provided in the container 60 or the control unit 40 of the imprint apparatus 100 controls the charging unit 62. The charging unit 62 can charge the first plate by, as described above, applying a voltage to the contactor 63 in a state in which the contactor 63 is in contact with the first plate, and separating, after a predetermined time elapses, the contactor 63 from the first plate in the state in which the voltage is applied to the contactor 63.

In step S14, the conveyance unit conveys the first plate contained in the container 60. Conveyance of the first plate is implemented by conveying the first plate from the container 60 to the pre-alignment unit 21 by the substrate conveyance unit 22, and then conveying the first plate from the pre-alignment unit 21 to the substrate stage 12 by the substrate conveyance unit 14a. In step S15, the substrate stage 12 that holds the first plate is driven. The substrate stage 12 can be driven in the same manner as that for driving the substrate stage 12 at the time of the imprint process. That is, a dummy imprint process that simulates the supply of the imprint material by the liquid supply unit and the mold pressing/release operation of the mold M is performed. This can cause the first plate to attract particles floating around the substrate stage 12 and particles adhering to the substrate stage 12 and its peripheral members. In step S16, the first plate held by the substrate stage 12 is collected by the substrate conveyance units 14a and 22, and conveyed to the container 60.

In step S17, the charging unit 62 of the container 60 charges the second plate to the second polarity. The second plate can be charged manually or automatically, similar to charging of the first plate. However, the switching unit 65 switches (changes) the power supply of the power supply unit 64 to be used. In step S18, the substrate conveyance units 14a and 22 convey, to the substrate stage 12, the second plate contained in the container 60. In step S19, the substrate stage 12 that holds the second plate is driven. Steps S18 and S19 can be performed, similar to steps S14 and S15. In step S20, the second plate held by the substrate stage 12 is collected by the substrate conveyance units 14a and 22, and conveyed to the container 60. In step S21, the neutralization units 15 and 23 are operated.

As described above, in this embodiment, in the imprint apparatus, the conveyance units convey the first and second plates charged to the polarities opposite to each other. This can cause the first and second plates to attract particles charged to the respective polarities, thereby effectively removing particles in the imprint apparatus.

Second Embodiment

The second embodiment of the present invention will be described. As described in the first embodiment, the charging unit 62 of the container 60 charges the plate P by applying a voltage to the contactor 63 in a state in which the contactor 63 is in contact with the plate P. At this time, if the contact state between the contactor 63 and the plate P is not satisfactory, the contact portion acts as a resistance, thereby inhibiting supply of electric charges to the plate P. To cope with this, a charging unit 62 according to this embodiment includes a detection unit 66 that detects the contact state between a contactor 63 and a plate P (that is, the conductive state between the contactor 63 and the plate P).

Figure 8:
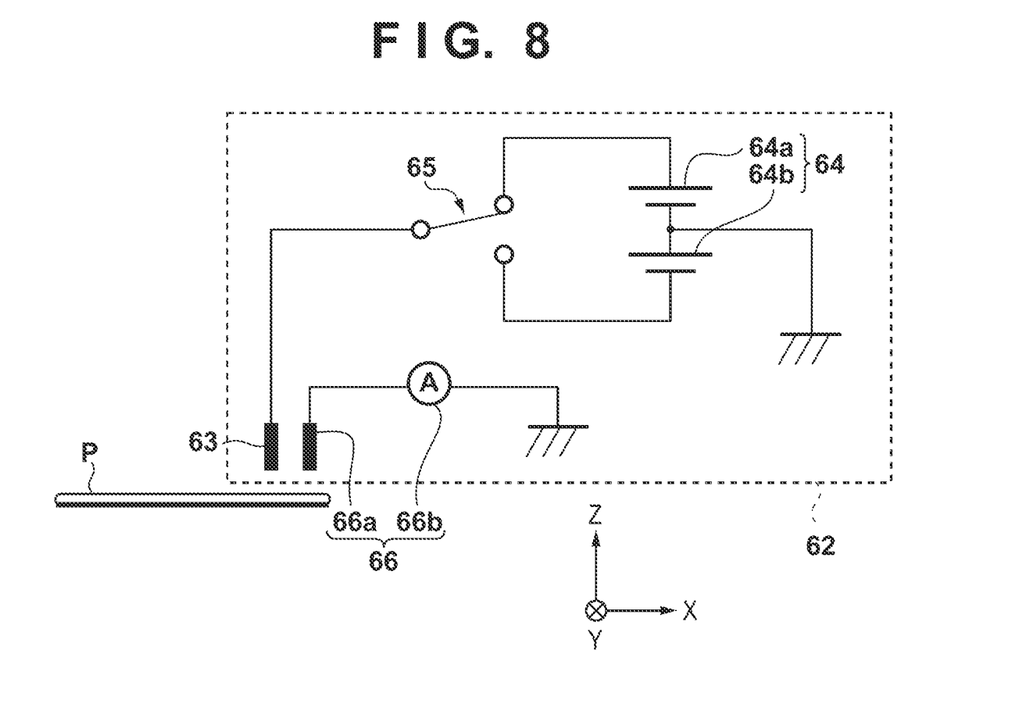
FIG. 8 is a view showing the arrangement of a charging unit including a detection unit.

FIG. 8 is a view showing the arrangement of the charging unit 62 including the detection unit 66. The detection unit 66 can include, for example, a second contactor 66a that contacts an exposed part of an electrically conductive member CM of the plate P, and an ammeter 66b that senses a current flowing between the contactor 63 and the second contactor 66a via the electrically conductive member CM of the plate P. If the detection unit 66 detects the contact state between the contactor 63 and the plate P, a voltage is applied to the contactor 63 in a state in which the contactor 63 and the second contactor 66a are in contact with the electrically conductive member CM of the plate P. The voltage at this time is preferably set to a value lower than a voltage when charging the plate P. If the contact state between the contactor 63 and the plate P is satisfactory (that is, conduction is obtained), the ammeter 66b responds to sense a desired current value. On the other hand, if the contact state between the contactor 63 and the plate P is defective (that is, no conduction is obtained), the ammeter 66b does not sense a desired current value or does not respond. By monitoring the current value sensed by the ammeter 66b, it is possible to detect (confirm) the contact state between the contactor 63 and the plate P.

If it is determined based on a detection result of the detection unit 66 that the contact state between the contactor 63 and the plate P is satisfactory, the second contactor 66a is separated from the plate P, and a voltage is applied to the contactor 63 in a state in which only the contactor 63 is in contact with the plate P, thereby charging the plate P. On the other hand, if it is determined that the contact state between the contactor 63 and the plate P is defective, the contactor 63 and the plate P are cleaned, and the contact position of the contactor 63 is changed, thereby detecting the contact state by the detection unit 66 again. By providing the detection unit 66, it is possible to avoid charging of the plate P in a state in which the contact between the contactor 63 and the plate P is defective, and to charge the plate P more efficiently.

Third Embodiment

The third embodiment of the present invention will be described. The above embodiment has explained the example of conveying, instead of the substrate W, the plate P for the cleaning process in the imprint apparatus by the substrate conveyance units 14a and 22 that convey the substrate W. This embodiment will describe an example of conveying, instead of a mold M (original), a plate P' for a cleaning process in an imprint apparatus by mold conveyance units 14b and 32 that convey the mold M.

An imprint apparatus according to this embodiment has the same arrangement as that of the imprint apparatus 100 according to the first embodiment. As shown in FIG. 1, a container 70 that contains the plate P' for the cleaning process is placed on a placement unit 34 of a storage unit 30, instead of a mold container 52. The placement unit 34 of the storage unit 30 is the load port of an EFEM, as described above, and can be formed as an arrangement table on which the mold container 52 is arranged or an attachment mechanism to which the mold container can be attached.

Figure 9:
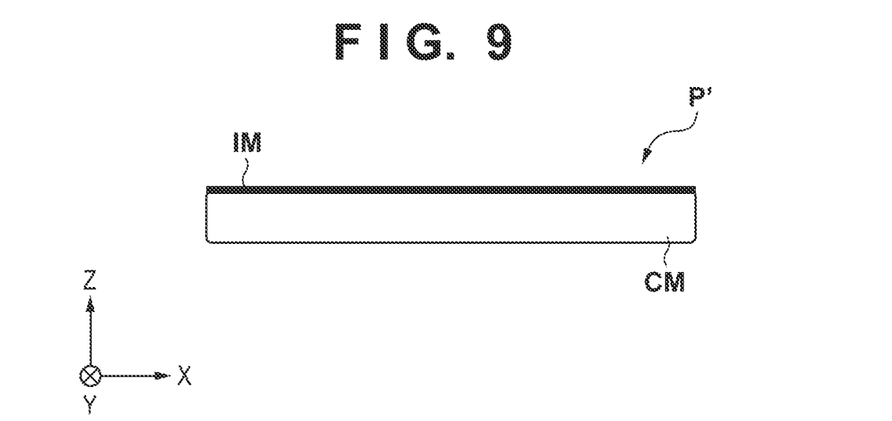
FIG. 9 is a view showing an example of the arrangement of a plate P'.

The plate P' contained in the container 70 preferably has the same outer shape as that of the mold M used in the imprint process, and is charged by a charging unit 72 provided in the container 70, as will be described later. The plate P' may be formed by only an electrically conductive member, but may have an arrangement in which at least part of an electrically conductive member is covered with an insulating member so as to maintain (hold) a state in which particles in the apparatus are attracted with an electrostatic force. In this embodiment, as shown in FIG. 9, the plate P' can include an electrically conductive member CM and an insulating member IM that covers the electrically conductive member CM so that a part of the electrically conductive member CM is exposed. In the example of the arrangement of the plate P' shown in FIG. 9, the insulating member IM is provided only on a surface (upper surface) held by a mold chuck 13a but the present invention is not limited to this. For example, the insulating member IM may be provided so that the electrically conductive member CM is exposed in a part which a contactor 73 of the charging unit 72 (to be described later) contacts. Similar to the plate P described in the first embodiment, as the electrically conductive member of the plate P' used in this embodiment, for example, a silicon substrate, a metal plate, a glass substrate, a resin plate, or the like can be applied. As the insulating member, an acrylic resin, a polyimide resin, a polyolefin resin, a polyamide resin, or the like can be applied.

Figure 10:
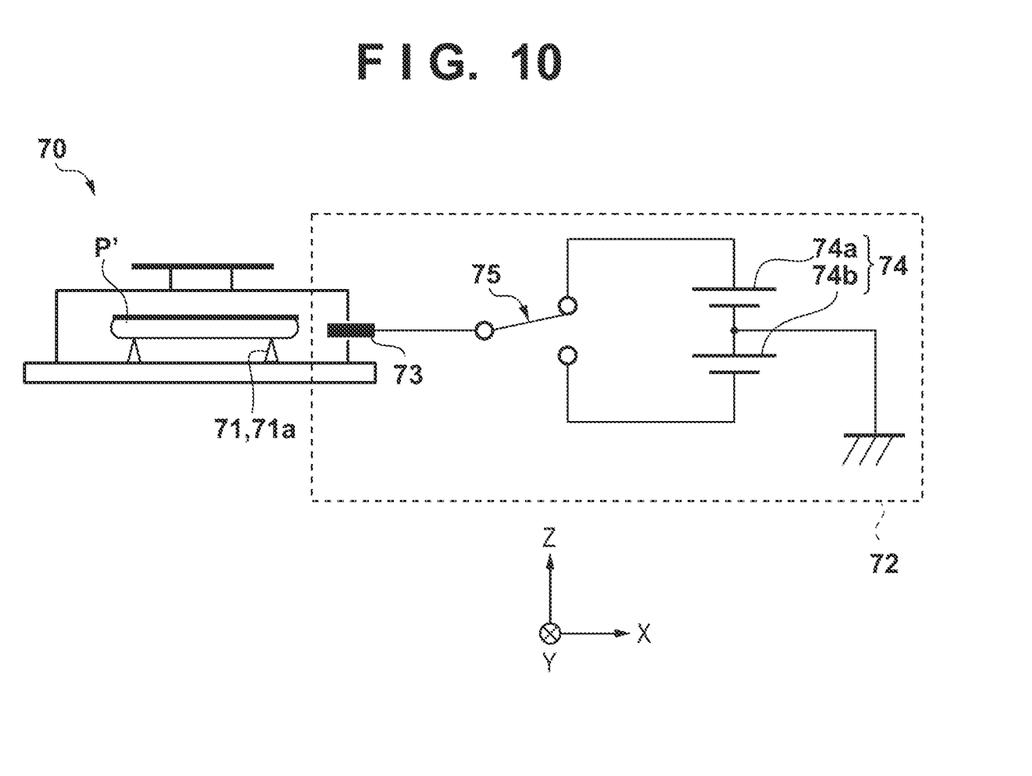
FIG. 10 is a view showing the arrangement of a container for containing the plate P'.

FIG. 10 is a view showing the arrangement of the container 70 that contains the plate P'. The container 70 is formed by, for example, a SMIF similar to the mold container 52, and can include a support unit 71 that supports the plate P', and the charging unit 72 that charges the plate P' supported by the support unit 71. In the example shown in FIG. 10, to make the arrangement easy to understand, the charging unit 72 is enlarged. The container 70 according to this embodiment may be provided with a detection unit 66 described in the second embodiment. If the plate P' is charged automatically, a control unit that controls the charging unit 72 may be provided in the container 70. When the container 70 is placed on the placement unit 34, the charging unit 72 and a control unit 40 of an imprint apparatus 100 may communicably be connected, and the control unit 40 may control the charging unit 72.

The support unit 71 can include, for example, a plurality of support pins 71a that contact the lower surface (an electrically conductive member in this embodiment) of the plate P'. The plurality of support pins 71a are preferably made of an insulating material so as to prevent electric charges from being released from the charged plate P. Furthermore, the charging unit 72 can be formed in the same manner as that for the charging unit 62 described in the first embodiment. More specifically, the charging unit 72 can include the contactor 73 (contact probe) that contacts an exposed part of the electrically conductive member CM of the plate P', a power supply unit 74 that applies a voltage to the plate P' via the contactor 73, and a switching unit 75 that switches a polarity to which the plate P' is charged. The contactor 73 may have an arrangement that includes a plunger and a barrel, or a rotating type arrangement including a terminal and a leaf spring. The power supply unit 74 can include a plurality of types of power supplies 74a and 74b so as to change the polarity to which the plate P' is charged. The switching unit 75 can be formed as a switch that switches the power supply to be electrically connected to the contactor 73 in order to charge the plate P' to the first or second polarity selectively.

Figure 11:
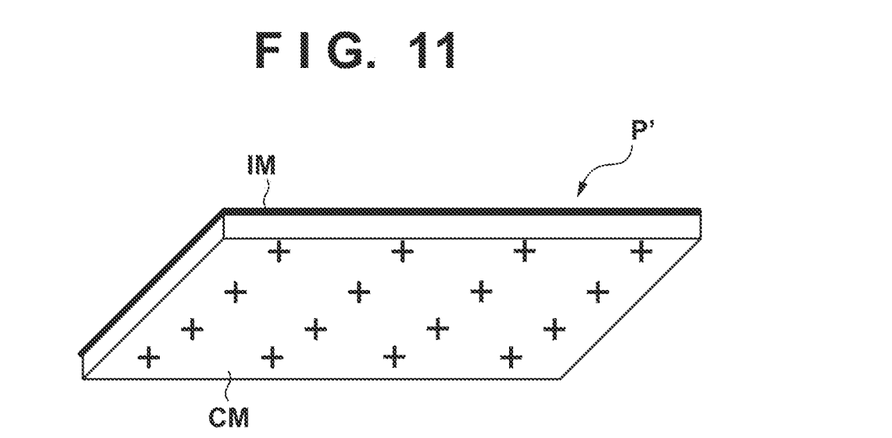
FIG. 11 is a view showing the charged plate P'.

The charging unit 72 with the above arrangement presses the contactor 73 against the exposed part of the electrically conductive member CM of the plate P' with a predetermined pressure, and applies, in this state, a voltage to the plate P' via the contactor 73 by the power supply unit 74, thereby supplying electric charges to the plate P'. Then, if a predetermined time elapses and a predetermined amount of electric charges is accumulated in the plate P', the contactor 73 is separated from the plate P' in a state in which the contactor 73 and the power supply unit 74 are connected to each other. As shown in FIG. 11, this can charge the plate P' and maintain (hold) the state in which the plate P' is charged.

In a cleaning process according to this embodiment, similar to the conveyance of the plate P by the substrate conveyance units 14a and 22 shown in the flowchart of FIG. 7, the mold conveyance units 14b and 32 convey, into the imprint apparatus, the plate P' charged by the charging unit 72 in the container 70. That is, in the cleaning process according to this embodiment, as "conveyance of the plate P to the substrate stage 12 by the substrate conveyance units 14a and 22" in the flowchart shown in FIG. 7, "the mold conveyance units 14b and 32 convey the plate P' to an imprint head 13".

More specifically, in a state in which the neutralization units 15 and 33 (original neutralization units) are stopped, the mold conveyance units 14b and 32 convey, to the imprint head 13, the plate P' charged to the first polarity by the charging unit 72. That is, the mold conveyance unit 32 conveys the plate P' from the container 70 to a stocker 31 of the storage unit 30, and the mold conveyance unit 14b conveys the plate P' from the stocker 31 to the imprint head 13. Then, after performing a dummy imprint process that simulates supply of an imprint material by a liquid supply unit and the mold pressing/release operation of the mold M, the plate P' held by the imprint head 13 is collected by the mold conveyance units 14b and 32, and conveyed to the container 70. Similarly, in the state in which the neutralization units 15 and 33 (original neutralization units) are stopped, the mold conveyance units 14b and 32 convey, to the imprint head 13, the plate P' charged to the second polarity by the charging unit 72. After performing the dummy imprint process, the plate P' held by the imprint head 13 is collected by the mold conveyance units 14b and 32, and conveyed to the container 70.

This can decrease particles floating around the imprint head 13 and particles adhering to the imprint head 13 and its peripheral members. The cleaning process of this embodiment in which the mold conveyance units 14b and 32 convey the charged plate P' may be performed in parallel to the cleaning process of the first embodiment in which the substrate conveyance units 14a and 22 convey the charged plate P.

Fourth Embodiment

The fourth embodiment of the present invention will be described. Each of the first to third embodiments has explained an arrangement in which a charging unit (62 or 72) is provided in a container (60 or 70) that contains a plate (P or P'). However, this embodiment will describe an arrangement in which a charging unit is provided in an imprint apparatus 100.

Figure 12:
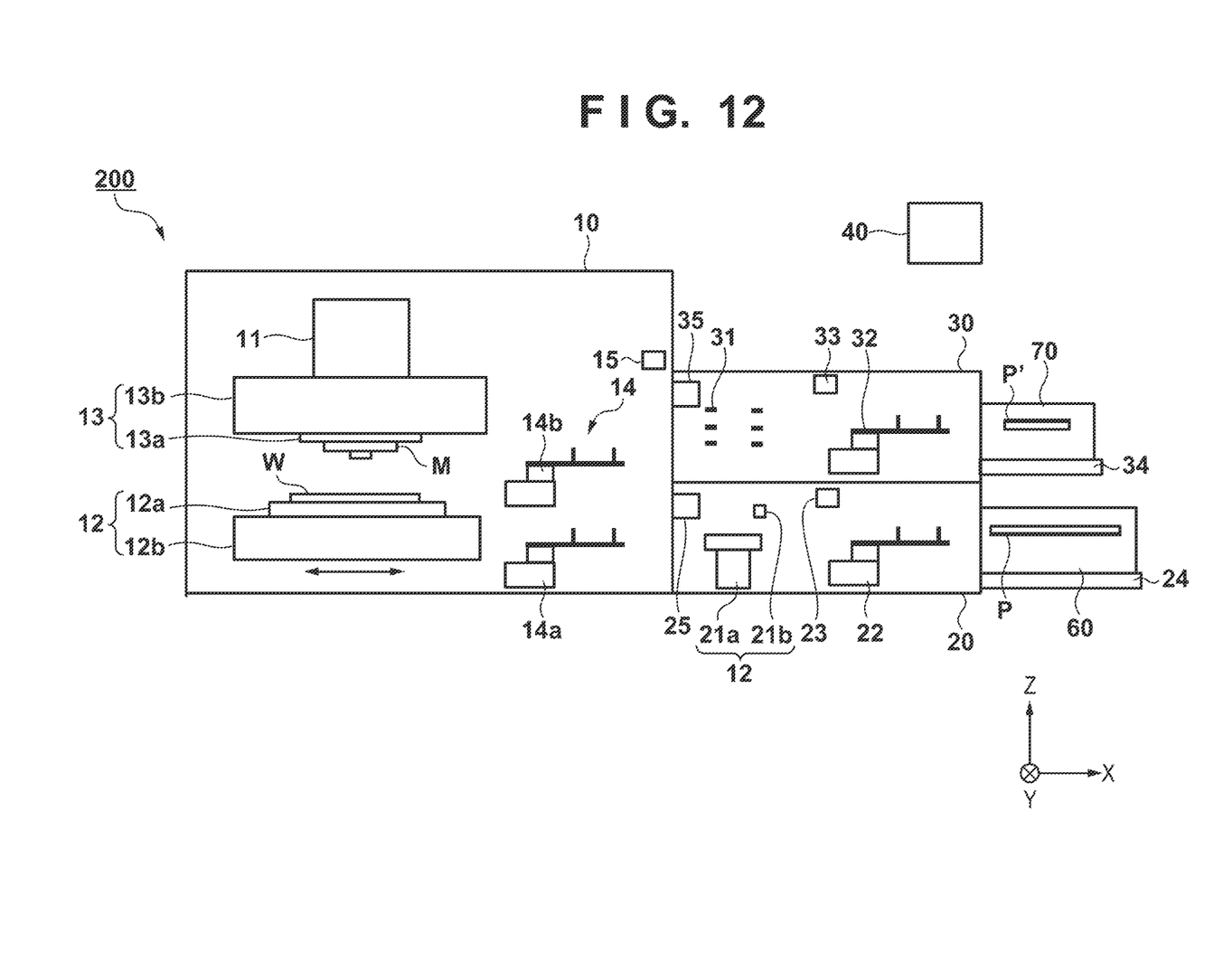
FIG. 12 is a schematic view showing the arrangement of an imprint apparatus according to the fourth embodiment.

FIG. 12 is a schematic view showing the arrangement of an imprint apparatus 200 according to this embodiment. The imprint apparatus 200 according to this embodiment can include a charging unit 25 that charges a plate P arranged in a pre-alignment unit 21 (holding unit 21a) of a preprocessing unit 20, and a charging unit 35 that charges a plate P' arranged in a stocker 31 of a storage unit 30. The remaining components of the imprint apparatus are the same as those described in each of the above-embodiments, and a description thereof will be omitted.

Figure 13A:
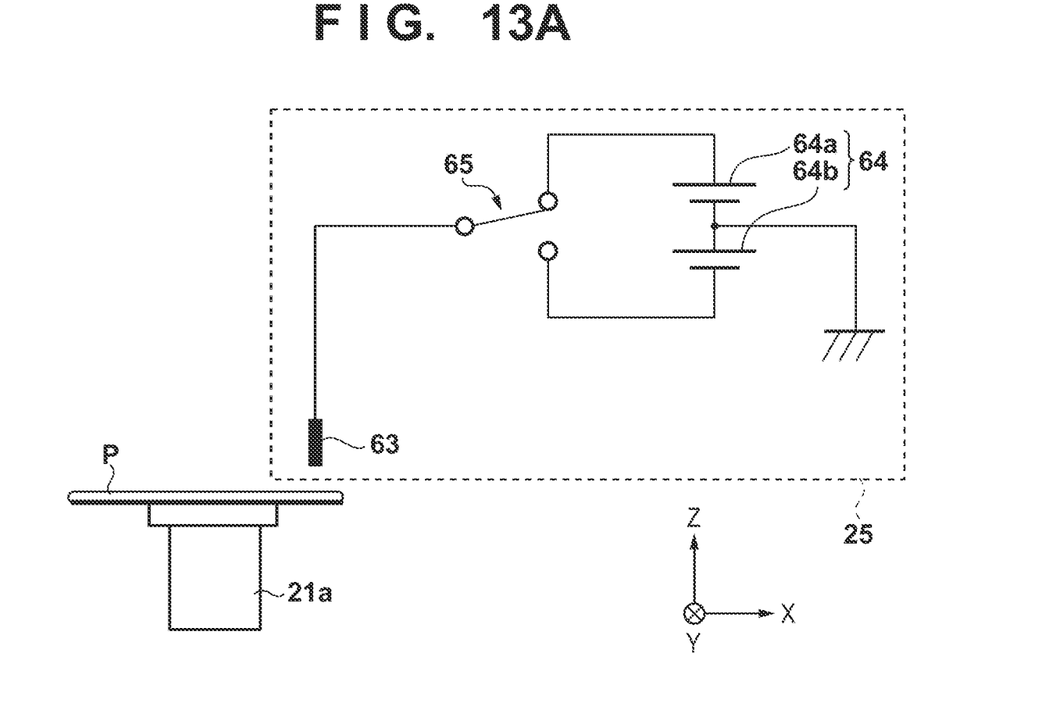
FIGS. 13A and 13B are schematic views each showing a state in which a plate is charged in the apparatus.

In a cleaning process according to this embodiment, in a state in which neutralization units 15 and 23 (substrate neutralization units) are stopped, a substrate conveyance unit 22 conveys the plate P from a container 60 to the pre-alignment unit 21 (holding unit 21a) of the preprocessing unit 20. As shown in FIG. 13A, the charging unit 25 charges the plate P. The charging unit 25 has the same arrangement as that of the charging unit 62 of the container 60 described in the first embodiment, and may be provided with a detection unit 66 described in the second embodiment. After a substrate conveyance unit 14a conveys the charged plate P from the pre-alignment unit 21 to a substrate stage 12, and a dummy imprint process is performed, the substrate conveyance units 14a and 22 convey the plate P from the substrate stage 12 to the container 60. This cleaning process may be performed using the plate P charged to each of the first and second polarities.

Figure 13B:
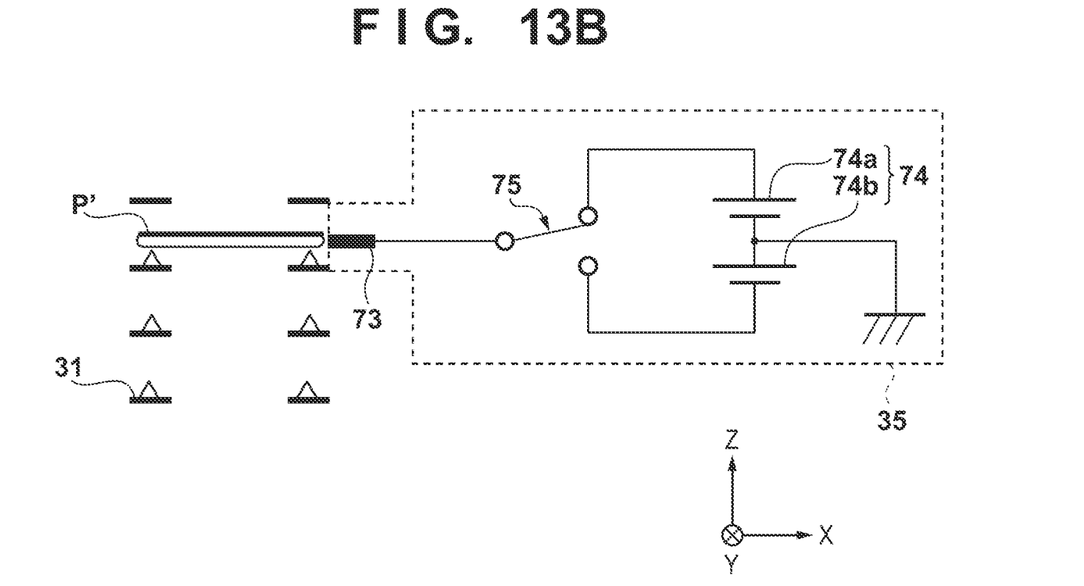

Similarly, in a state in which the neutralization unit 15 and a neutralization unit 33 (original neutralization units) are stopped, a mold conveyance unit 32 conveys the plate P' from a container 70 to the stocker 31 of the storage unit 30. Then, as shown in FIG. 13B, the charging unit 35 charges the plate P'. The charging unit 35 has the same arrangement as that of the charging unit 72 of the container 70 described in the third embodiment, and may be provided with the detection unit 66 described in the second embodiment. After a mold conveyance unit 14b conveys the charged plate P' to an imprint head 13, and the dummy imprint process is performed, the mold conveyance units 14b and 32 convey the plate P' from the imprint head 13 to the container 70. This cleaning process may be performed using the plate P' charged to each of the first and second polarities, and may be performed in parallel to the cleaning process in which the substrate conveyance units 14a and 22 convey the charged plate P.

As described above, in this embodiment, the charging units 25 and 35 that charge the plates are provided in the imprint apparatus. This can charge the plate in the imprint apparatus without providing any charging units in the containers 60 and 70 each of which contains the plate. Therefore, this embodiment is advantageous in automating the cleaning process, and can remove particles in the imprint apparatus effectively.

<Embodiment of Method of Manufacturing Article>

A method of manufacturing an article according to an embodiment of the present invention is suitable for manufacturing an article, for example, a microdevice such as a semiconductor device or an element having a microstructure. The method of manufacturing the article according to this embodiment includes a step of performing a process of removing a particle in a substrate processing apparatus (imprint apparatus) using the method described in each of the above-described embodiments, and a step of processing a substrate using the substrate processing apparatus having undergone the removing process. If the imprint apparatus is applied as the substrate processing apparatus, the step of processing the substrate includes a step of forming, using the imprint apparatus, a pattern on an imprint material supplied (applied) to the substrate, and a step of processing the substrate with the pattern formed in the above step. This manufacturing method further includes other known steps (oxidation, deposition, vapor deposition, doping, planarization, etching, resist separation, dicing, bonding, packaging, and the like). The method of manufacturing the article according to this embodiment is advantageous in at least one of the performance, quality, productivity, and production cost of the article, as compared with a conventional method.

The pattern of a cured product formed using the imprint apparatus is used permanently for at least some of various kinds of articles or temporarily when manufacturing various kinds of articles. The articles are an electric circuit element, an optical element, a MEMS, a recording element, a sensor, a mold, and the like. Examples of the electric circuit element are volatile and nonvolatile semiconductor memories such as a DRAM, a SRAM, a flash memory, and a MRAM and semiconductor elements such as an LSI, a CCD, an image sensor, and an FPGA. Examples of the mold are molds for imprint.

The pattern of the cured product is directly used as the constituent member of at least some of the above-described articles or used temporarily as a resist mask. After etching or ion implantation is performed in the substrate processing step, the resist mask is removed.

Figure 14A:
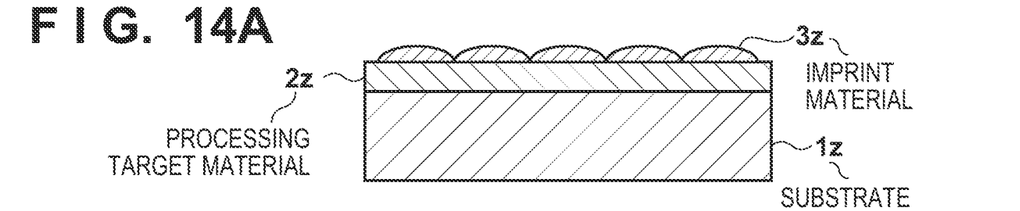
FIGS. 14A to 14F are views showing a method of manufacturing an article.

A detailed method of manufacturing an article will be described next. As shown in FIG. 14A, a substrate 1z such as a silicon wafer with a processed material 2z such as an insulator formed on the surface is prepared. Next, an imprint material 3z is applied to the surface of the processed material 2z by an inkjet method or the like. A state in which the imprint material 3z is applied as a plurality of droplets onto the substrate is shown here.

Figure 14B:
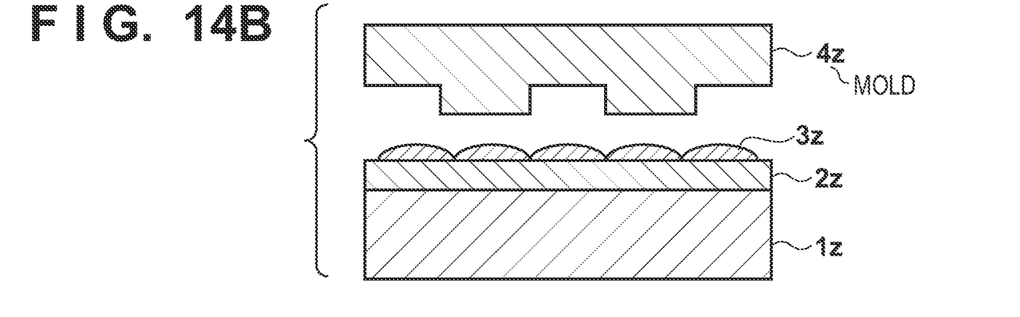
Figure 14C:
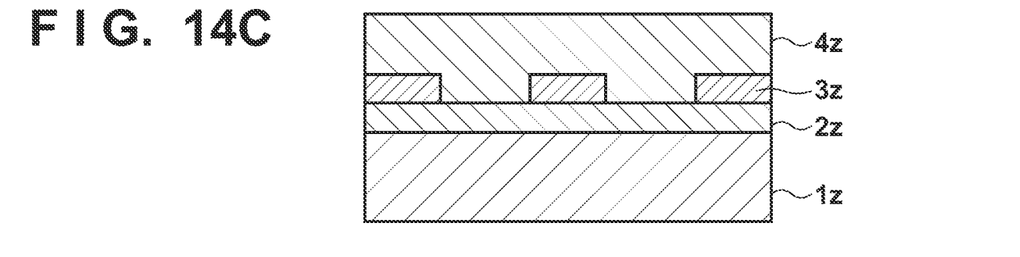

As shown in FIG. 14B, a side of a mold 4z for imprint with an uneven pattern is directed to and caused to face the imprint material 3z on the substrate. As shown in FIG. 14C, the substrate 1z to which the imprint material 3z is applied is brought into contact with the mold 4z, and a pressure is applied. The gap between the mold 4z and the processed material 2z is filled with the imprint material 3z. In this state, when the imprint material 3z is irradiated with energy for curing through the mold 4z, the imprint material 3z is cured.

Figure 14D:
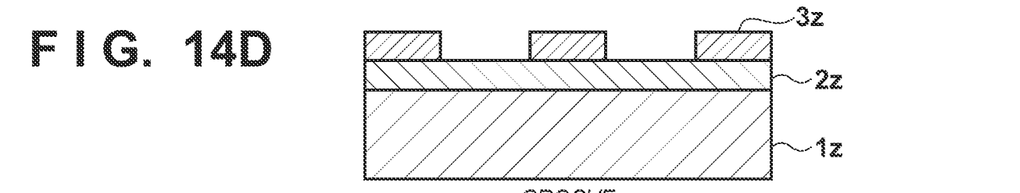

As shown in FIG. 14D, after the imprint material 3z is cured, the mold 4z is separated from the substrate 1z. Then, the pattern of the cured product of the imprint material 3z is formed on the substrate 1z. In the pattern of the cured product, the concave portion of the mold corresponds to the convex portion of the cured product, and the convex portion of the mold corresponds to the concave portion of the cured product. That is, the uneven pattern of the mold 4z is transferred to the imprint material 3z.

Figure 14E:
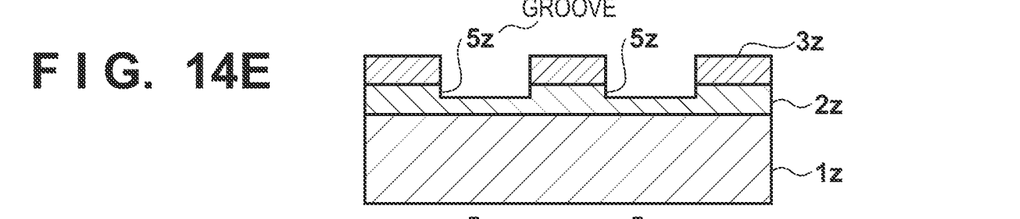
Figure 14F:
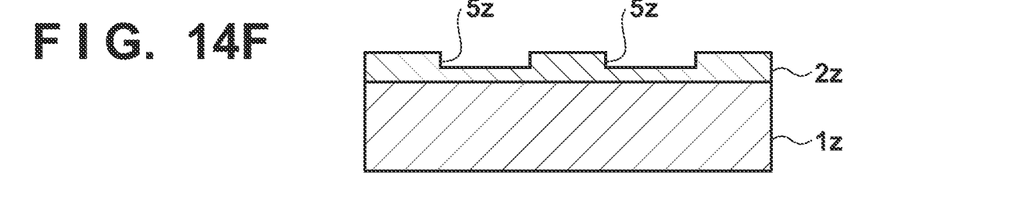

As shown in FIG. 14E, when etching is performed using the pattern of the cured product as an etching resistant mask, a portion of the surface of the processed material 2z where the cured product does not exist or remains thin is removed to form a groove 5z. As shown in FIG. 14F, when the pattern of the cured product is removed, an article with the grooves 5z formed in the surface of the processed material 2z can be obtained. Here, the pattern of the cured product is removed. However, instead of processing or removing the pattern of the cured product, it may be used as, for example, an interlayer dielectric film included in a semiconductor element or the like, that is, a constituent member of an article.

Other Embodiments

Embodiment(s) of the present invention can also be realized by a computer of a system or apparatus that reads out and executes computer executable instructions (e.g., one or more programs) recorded on a storage medium (which may also be referred to more fully as a 'non-transitory computer-readable storage medium') to perform the functions of one or more of the above-described embodiment(s) and/or that includes one or more circuits (e.g., application specific integrated circuit (ASIC)) for performing the functions of one or more of the above-described embodiment(s), and by a method performed by the computer of the system or apparatus by, for example, reading out and executing the computer executable instructions from the storage medium to perform the functions of one or more of the above-described embodiment(s) and/or controlling the one or more circuits to perform the functions of one or more of the above-described embodiment(s). The computer may comprise one or more processors (e.g., central processing unit (CPU), micro processing unit (MPU)) and may include a network of separate computers or separate processors to read out and execute the computer executable instructions. The computer executable instructions may be provided to the computer, for example, from a network or the storage medium. The storage medium may include, for example, one or more of a hard disk, a random-access memory (RAM), a read only memory (ROM), a storage of distributed computing systems, an optical disk (such as a compact disc (CD), digital versatile disc (DVD), or Blu-ray Disc (BD)™), a flash memory device, a memory card, and the like.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2018-226725 filed on Dec. 3, 2018, which is hereby incorporated by reference herein in its entirety.

What is claimed is:

1. A container for containing and charging a plate to be conveyed into a processing apparatus for processing a substrate, in order to remove particles in the processing apparatus by attracting the particles to the plate, the container comprising:
a supporting member configured to support the plate such that the supporting member and the plate are electrically insulated from each other; and
a contactor connected to a power supply,
wherein in a state where the plate is supported by the supporting member, the contactor is configured to be movable so as to (i) contact the plate and charge the plate by supplying electric charges from the power supply to the plate via the contactor and then (ii) be spaced apart from the plate, and
wherein the container is a Front Opening Unified Pod (FOUP) or a Standard Mechanical Interface (SMIF) pod.

2. The container according to claim 1, wherein the power supply is configured to supply a voltage to the contactor that contacts the plate, and the contactor is separated from the plate while the voltage is being supplied to the contactor from the power supply.

3. The container according to claim 1, further comprising:
a switch connecting the contactor to the power supply,
wherein the power supply includes a first power supply configured to supply an electric charge having a first polarity and a second power supply configured to supply an electric charge having a second polarity different from the first polarity, and
wherein the switch is configured to change a polarity to which the plate is charged by being selectively connected to the first power supply or the second power supply.

4. The container according to claim 1, further comprising:
a detector configured to detect a contact state between the contactor and the plate.

5. The container according to claim 4, wherein the detector includes a sensor and a second contactor, the second contactor being configured to contact the plate, and
wherein the detector is configured to detect the contact state between the contactor and the plate by the sensor detecting a current flowing between the contactor and the second contactor via the plate.

6. The container according to claim 1, wherein
the plate includes an electrically conductive member and an insulating member configured to cover the electrically conductive member so that a part of the electrically conductive member is exposed, and
the contactor is configured to contact the exposed part of the electrically conductive member of the plate.

7. A processing apparatus for processing a substrate, comprising:
a placement unit on which a container according to claim 1 is placed; and
a conveyance unit configured to convey a plate charged in the container placed on the placement unit.

* * * * *